United States Patent
Yang et al.

(10) Patent No.: US 8,729,921 B2
(45) Date of Patent: May 20, 2014

(54) TERMINAL DISCRIMINATING APPARATUS AND TERMINAL DISCRIMINATING METHOD USING THE SAME

(75) Inventors: Seung Jei Yang, Daejeon (KR); Myeong Ryeol Choi, Daejeon (KR); Seung Yong Lee, Daejeon (KR); Nam Deok Cho, Daejeon (KR); Tae Joo Chang, Daejeon (KR); Cheol Won Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 923 days.

(21) Appl. No.: 12/878,808

(22) Filed: Sep. 9, 2010

(65) Prior Publication Data

US 2011/0234254 A1 Sep. 29, 2011

(30) Foreign Application Priority Data

Mar. 26, 2010 (KR) .................. 10-2010-0027201

(51) Int. Cl.
*G01R 31/28* (2006.01)
(52) U.S. Cl.
CPC ........ *G01R 31/2805* (2013.01); *G01R 31/2808* (2013.01)
USPC ................... 324/763.01; 324/691; 324/750.3
(58) Field of Classification Search
CPC .......... G01R 31/2808; G01R 31/2818; G01R 31/2805; G01R 31/043; G01R 31/045; G01R 31/28; G01R 31/3163; G01R 31/316; G01R 1/07328; H05K 1/0268; H01R 9/09; H01R 9/091; H01R 12/00; H01R 9/0515
USPC ................................. 324/763.01, 691, 750.3
See application file for complete search history.

(56) References Cited

U.S. PATENT DOCUMENTS

| | | | |
|---|---|---|---|
| 4,335,374 A * | 6/1982 | Nyuji ............................ 341/26 |
| 6,225,818 B1 | 5/2001 | Park et al. | |
| 2007/0011544 A1 * | 1/2007 | Shen et al. ..................... 714/742 |
| 2007/0080697 A1 * | 4/2007 | Tseng et al. ................... 324/691 |
| 2007/0152692 A1 | 7/2007 | Kinsley | |
| 2008/0147891 A1 | 6/2008 | Gregg | |

FOREIGN PATENT DOCUMENTS

| | | |
|---|---|---|
| KR | 10-1999-0084336 A | 12/1999 |
| KR | 10-2006-0131659 A | 12/2006 |
| KR | 10-2008-0035456 A | 4/2008 |
| KR | 10-2008-0089374 A | 10/2008 |
| KR | 10-2009-0002208 A | 1/2009 |

* cited by examiner

*Primary Examiner* — Patrick Assouad
*Assistant Examiner* — Sean Curtis
(74) *Attorney, Agent, or Firm* — LRK Patent Law Firm

(57) ABSTRACT

A terminal discriminating apparatus and a terminal discriminating method using the same are provided. The terminal discriminating apparatus includes: a measurement unit for measuring a pull-up voltage and a pull-down voltage of each of candidate terminals to be discriminated; a discriminating unit for comparing the pull-up voltages, pull-down voltages, and the differences between the pull-up voltages and pull-down voltages for the candidate terminals to discriminate the types of the candidate terminals; and an output unit for outputting results of the discrimination of the candidate terminals transferred from the discriminating unit. The types of the candidate terminals can be discriminated by comparing the pull-up voltage, the pull-down voltage, and the differences between the pull-up voltages and the pull-down voltages for the candidate terminals.

16 Claims, 10 Drawing Sheets

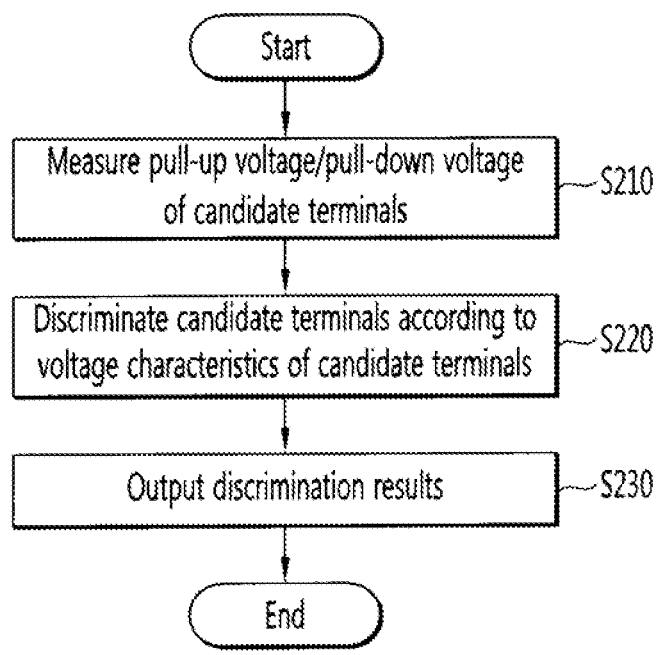

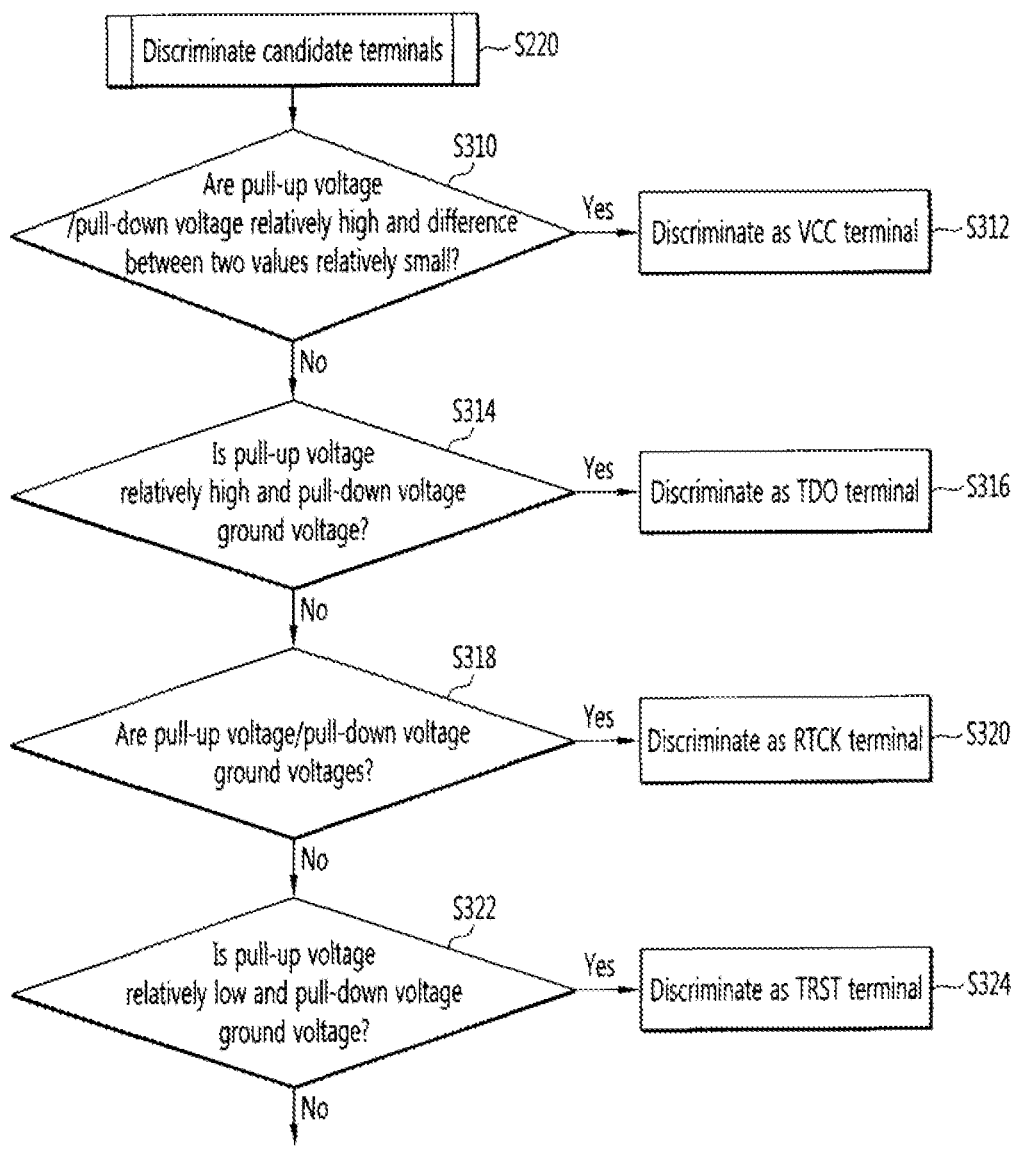

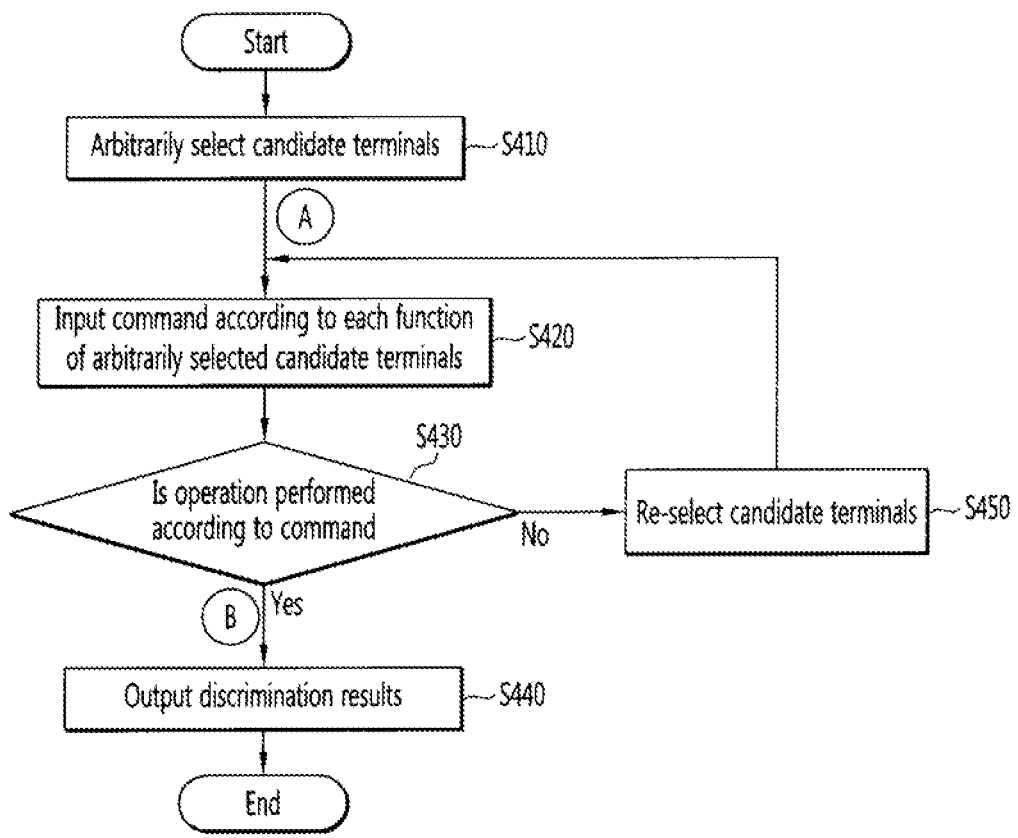

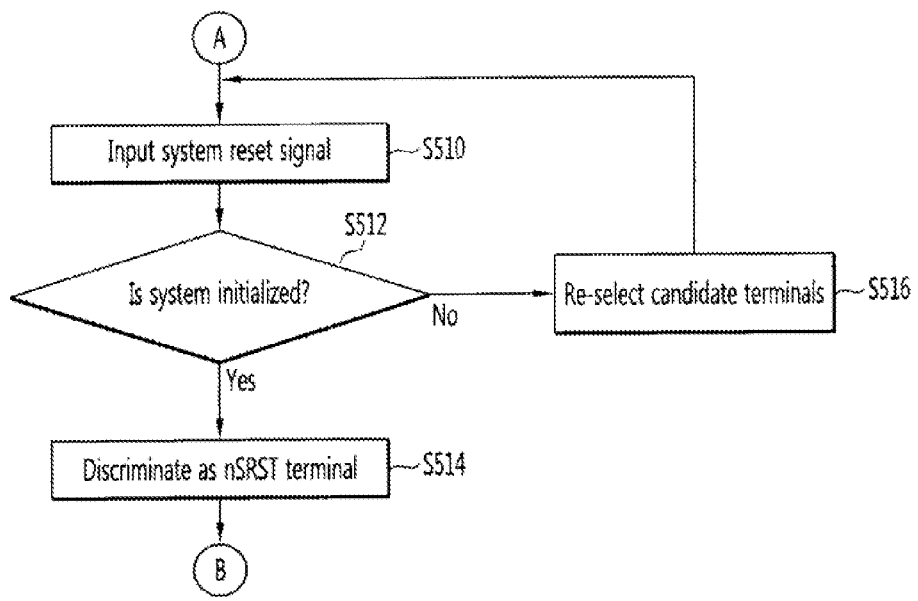
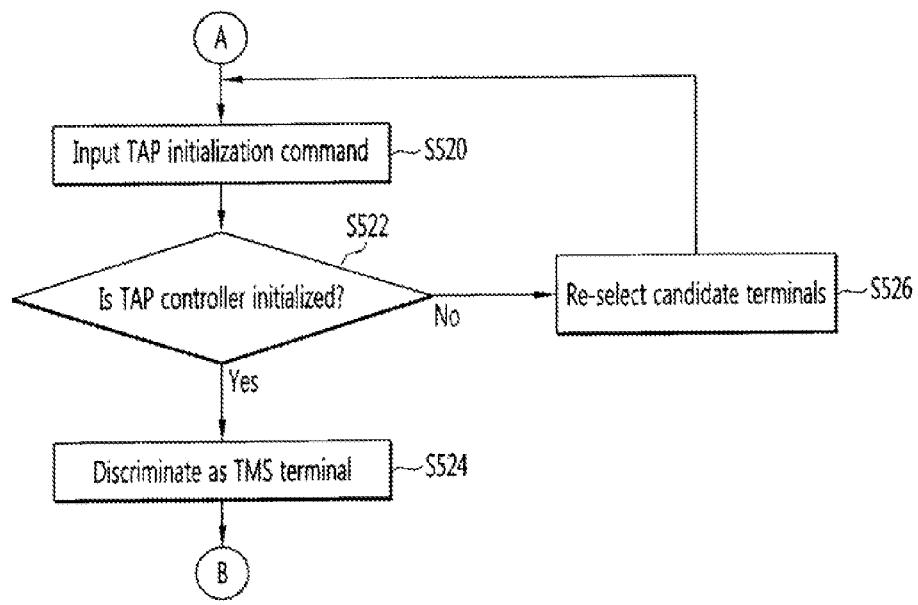

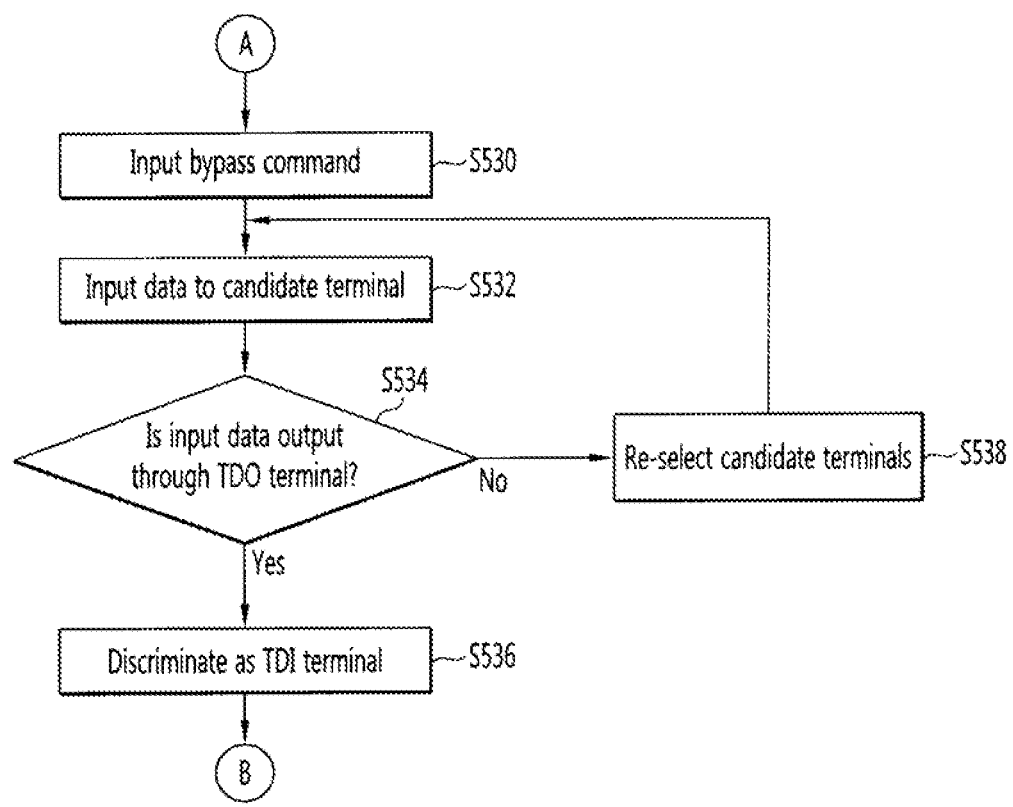

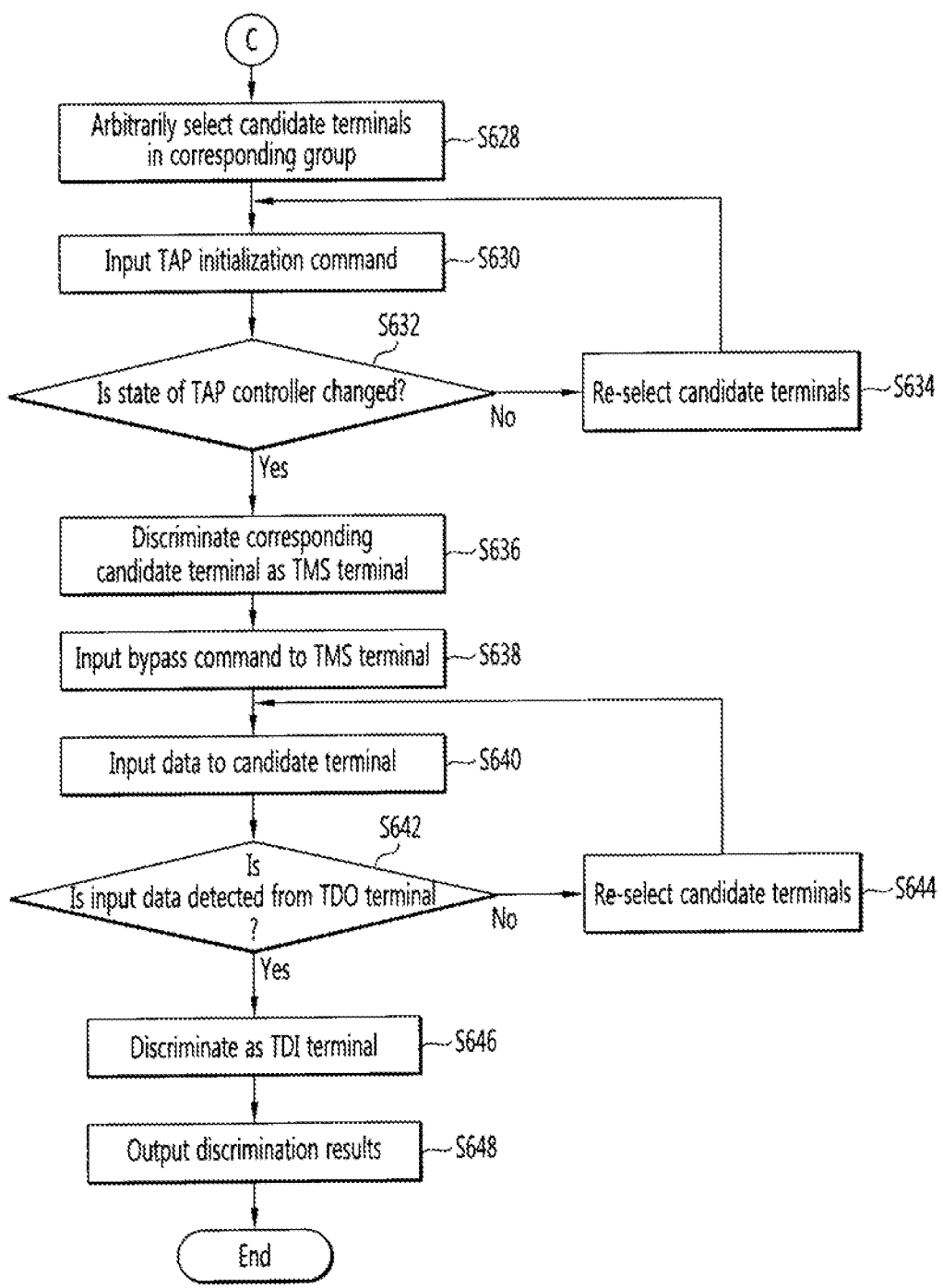

TERMINAL DISCRIMINATING APPARATUS AND TERMINAL DISCRIMINATING METHOD USING THE SAME

CROSS-REFERENCE TO RELATED APPLICATION

This application claims priority to and the benefit of Korean Patent Application No. 10-2010-0027201, filed Mar. 26, 2010, the disclosure of which is incorporated herein by reference in its entirety.

BACKGROUND

1. Field of the Invention

The present invention relates to a terminal discriminating apparatus and a method for discriminating a terminal using the same. More particularly, the present invention relates to an apparatus for discriminating a joint test access group (JTAG) terminal on a system printed circuit board (PCB) and a method for discriminating a terminal using the same.

2. Discussion of Related Art

Terminals having various functions are provided on a system PCB. Thus, in order to normally operate the system, a pin-map of each terminal must be checked and a command must be transferred to the terminal having a corresponding function. Otherwise, an erroneous command may be transferred to a terminal having a different function, and thus the system may malfunction or may not react.

Thus, when there is no information regarding a terminal on the system PCB, an apparatus or method for discriminating a pin-map of each terminal is required in order to normally operate the system.

For example, Joint Test Access Group (JTAG) will be described. JTAG provides the function capable of driving all the external terminals of the system or reading values, so that it is used to test an internal core or board of the system. In addition, the JTAG may be connected to a JTAG emulator in order to program a flash memory device. In an embedded system, the JTAG can install firmware in the flash memory device and read data from the flash memory device through the JTAG emulator. For example, the JTAG may upload a boot program to the flash memory device or directly access a controller of the flash memory device to dump data from the flash memory device.

Thus, in order to accurately test the internal core or board of the system, an accurate command needs to be transferred to a JTAG terminal on the PCB of the system. Also, in connecting the JTAG emulator, the JTAG emulator must be connected to an accurate terminal and an accurate command corresponding to the terminal must be transferred to the terminal.

Here, when identification information of the JTAG terminal on the PCB of the system is presented on the PCB or when a pin-map of the JTAG terminal is provided through a data sheet, the JTAG terminal can be easily discriminated. However, if such information is not provided, the JTAG terminal cannot be discriminated (or identified), making it impossible to test the internal core or board of the system. Additionally, an inappropriate terminal and the JTAG emulator are likely to be connected erroneously to cause the system to malfunction or not react.

Therefore, a JTAG terminal discriminating apparatus and method capable of discriminating a terminal provided on the system PCB to discriminate a pin-map of a JTAG terminal are required.

SUMMARY OF THE INVENTION

The present invention is directed to a terminal discriminating apparatus for discriminating a terminal on a system PCB and a terminal discriminating method using the same.

One aspect of the present invention provides a terminal discriminating apparatus including: a measurement unit for measuring a pull-up voltage and a pull-down voltage of each of candidate terminals to be discriminated; a discriminating unit for comparing the pull-up and pull-down voltages which have been measured by the measurement unit, and the differences between the pull-up and pull-down voltages for the candidate terminals to discriminate the types of the candidate terminals; and an output unit for outputting results of the discrimination of the candidate terminals transferred from the discriminating unit.

Another aspect of the present invention provides a method for discriminating a terminal using a terminal discriminating apparatus, including: measuring a pull-up voltage and a pull-down voltage of each of candidate terminals to be discriminated; comparing the pull-up and pull-down voltages measured in the measurement operation, and the differences between the pull-up and pull-down voltages for the candidate terminals to discriminate the candidate terminals; and outputting results of the discrimination of the candidate terminals.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIG. 2 is a flow chart illustrating the process of a terminal discriminating method using the terminal discriminating apparatus according to an exemplary embodiment of the present invention;

FIG. 3a is a flow chart illustrating the process of a method for discriminating candidate terminals according to voltage characteristics of the candidate terminals using the terminal discriminating apparatus according to an exemplary embodiment of the present invention;

FIG. 4 is a flow chart illustrating the process of a method for discriminating candidate terminals using the terminal discriminating apparatus according to an exemplary embodiment of the present invention;

FIGS. 5a to 5c are flow charts illustrating the process of a method for discriminating candidate terminals using the terminal discriminating apparatus according to an exemplary embodiment of the present invention;

FIGS. 6a and 6b are flow charts illustrating a method for discriminating terminals using the terminal discriminating apparatus according to an exemplary embodiment of the present invention.

DETAILED DESCRIPTION OF EMBODIMENTS

The present invention will be described more fully hereinafter with reference to the accompanying drawings, in which exemplary embodiments of the invention are shown. This invention may, however, be embodied in different forms and should not be construed as limited to the embodiments set forth herein.

Figure 1A:
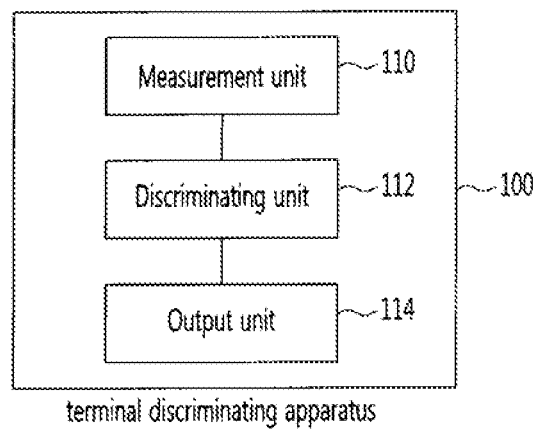
FIG. 1a is a schematic block diagram of a terminal discriminating apparatus according to an exemplary embodiment of the present invention.

FIG. 1a is a schematic block diagram of a terminal discriminating apparatus according to an exemplary embodiment of the present invention.

As illustrated in FIG. 1a, a terminal discriminating apparatus 100 includes a measurement unit 110 that measures a pull-up voltage and a pull-down voltage of each of candidate terminals to be discriminated, a discriminating unit 112 that compares the pull-up voltages, the pull-down voltages, and the differences between the pull-up voltages and the pull-down voltages for the candidate terminals to discriminate the types of the candidate terminals, and an output unit 114 that outputs results of the discrimination of the candidate terminals transferred from the discriminating unit 112.

The measurement unit 110 measures the pull-up voltage and the pull-down voltage of each of the candidate terminals to recognize the voltage characteristics of the candidate terminals. Here, the candidate terminals are those distributed on a PCB of a system, which refer to terminals to be discriminated using the terminal discriminating apparatus 100.

The discriminating unit 112 discriminates the candidate terminals according to the voltage characteristics measured by the measurement unit 110. The respective terminals have different voltage characteristics according to their functions, so that the voltage characteristics of the candidate terminals may be compared and the respective candidate terminals can be discriminated according to the relative differences in their voltage characteristics.

Here, the voltage characteristics of the respective terminals may be checked using the pull-up voltages and the pull-down voltages of the respective terminals. A pull-up voltage and a pull-down voltage of each terminal have a relatively large or small value according to the function of each terminal, and the difference between the pull-up voltage and the pull-down voltage also has a relatively large or small value. Thus, by comparing the measurement values of the pull-up voltages and the pull-down voltages, and the differences between the pull-up voltages and the pull-down voltages for the candidate terminals, the candidate terminals can be discriminated according to their voltage characteristics.

In this case, the discriminating unit 112 can calculate a maximum value and a reference value based on the pull-up voltages and the pull-down voltages of the candidate terminals measured by the measurement unit 110 and compare the candidate terminals based on the calculated maximum value and the reference value.

Here, the range of the pull-up voltage and pull-down voltage measurement values of the candidate terminals may be analyzed and the greatest value may be set as the maximum value. For example, when analog signals are expressed as digital values through an analog-to-digital converter (ADC) measurement and the measured pull-up voltages and pull-down voltages range from 0 to 255, the maximum value may be determined as 255. In this case, when a pull-up voltage or pull-down voltage of a certain candidate terminal is within a certain range from the maximum value, it may be determined that the corresponding candidate terminal has a relatively high pull-up voltage or pull-down voltage, and herein, the certain range may be 10 to 30.

The reference value is used to compare a difference value between the pull-up voltage and the pull-down voltage of each of the candidate terminals. For example, when analog signals are expressed as digital values through an analog-to-digital converter (ADC) measurement and the measured range of the pull-up voltage and the pull-down voltage is 0 to 255, the reference value may be determined as 10. In this case, when a pull-up voltage and a pull-down voltage of a certain candidate terminal are within a certain range from the maximum value and the difference between the pull-up voltage and the pull-down voltage is smaller than the reference value, the candidate terminal is discriminated as a VCC terminal. Also, when the pull-up voltage and pull-down voltage of the certain candidate terminal are within a certain range from the maximum value and the difference between the pull-up voltage and the pull-down voltage is greater than the reference value, the candidate terminal may be classified into a first group.

Of course, the numerical values of the maximum value and the reference value may vary depending on how the respective terminals are configured by hardware, and preferably, the maximum value and the reference value are determined relatively based on the measurement results of the measurement unit 110. An exemplary embodiment in which candidate terminals are discriminated by comparing the pull-up voltages and the pull-down voltages, and the differences between the pull-up voltages and the pull-down voltages for the candidate terminals will be described later.

The discriminating unit 112 arbitrarily selects candidate terminals and then inputs commands according to respective functions to the selected candidate terminals to determine whether or not operations are properly performed according to the commands, thereby discriminating the candidate terminals. Namely, when the system properly performs an operation according to a command, the discriminating unit 112 determines that a corresponding candidate terminal has been appropriately selected, and when the system does not perform an operation according to a command, the discriminating unit 112 determines that the corresponding candidate terminal has been erroneously selected, and re-selects candidate terminals. An exemplary embodiment in which candidate terminals are arbitrarily selected and discriminated according to input commands will be described later.

The output unit 114 serves to output the discrimination results from the discriminating unit 112. Preferably, the output unit 114 outputs a discriminated pin-map of each of the terminals. Here, the output unit 114 may output the results of the discrimination of the candidate terminals individually or separately, or may provide discriminated pin-maps after all the candidate terminals are completely discriminated.

Figure 1B:
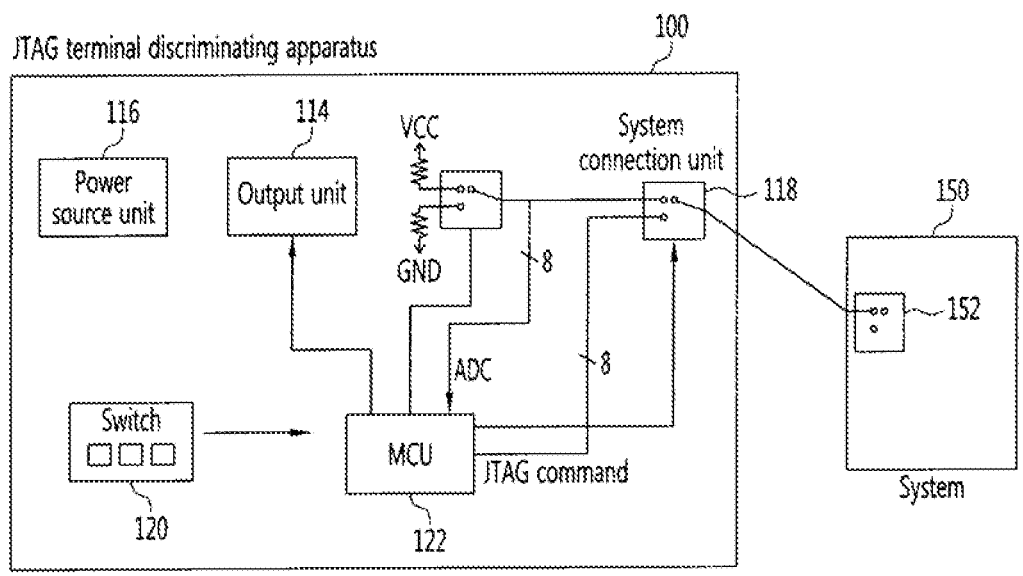
FIG. 1b is a schematic block diagram of a JTAG terminal discriminating apparatus according to an exemplary embodiment of the present invention.

FIG. 1b is a schematic block diagram of a terminal discriminating apparatus according to an exemplary embodiment of the present invention. In particular, FIG. 1b shows the configuration of a terminal discriminating apparatus for discriminating a JTAG terminal. Here, the same reference numerals are used for the same elements of the terminal discriminating apparatus as those illustrated in FIG. 1a, and thus a repeated description will be omitted.

An overall interface of JTAG is controlled by five terminals: a test data in (TDI) terminal; a test data out (TDO) terminal; a test clock (TCK) terminal; a test reset (TRST) terminal; and a test mode select (TMS) terminal. Thus, the JTAG terminal discriminating apparatus according to an exemplary embodiment of the present invention is configured to discriminate the foregoing five terminals. Of course, besides the live terminals for controlling the JTAG on the PCB of the system, a VCC terminal to which a power voltage is applied, a return test clock (RTCK) terminal for feeding back a clock generated by the TCK terminal to maintain synchronization between the system and a JTAG emulator, or an nSRST (nRESET) terminal for initializing the system is also generally distributed on the PCB of the system, so that the JTAG terminal discriminating apparatus can be configured to discriminate even the VCC terminal, the RTCK terminal, or the nSRST terminal, as well as the aforementioned five terminals.

As illustrated in FIG. 1b, the terminal discriminating apparatus 100, which includes an output unit 114, a power source unit 116, a system connection unit 118, a switch 120, and a micro-controller unit (MCU) 122, is connected to a system 150 to discriminate candidate terminals on the PCB of the system 150.

The system connection unit 118 is connected with candidate terminals distributed in groups on the PCB of the system 150. For example, the system connection unit 118 may be connected in the form of a connector of the JTAG emulator or connected with the candidate terminals 152 in a one-to-one corresponding manner out of turn. Here, reference numeral 152 denotes an area of the system 150 in which the candidate terminals aggregate.

The power source unit 116 supplies a power source voltage to the terminal discriminating apparatus 100. For example, preferably, the power source unit 116 stably supplies about 3.3 V through a regulator.

The MCU 122 measures the voltage characteristics, namely, pull-up voltages and pull-down voltages of the candidate terminals connected via the system connection unit 118, respectively, and compares the measured pull-up and pull-down voltages to analyze their relative voltage characteristics, thereby discriminating the candidate terminals. Also, the MCU 122 generates a data source, namely, a command, according to the JTAG standard and transmits the generated command to the system 150. Here, the MCU 122 corresponds to the measurement unit 110 and the discriminating unit 112 as described above with reference to FIG. 1a.

The switch 120 serves to control the sequential operations of measuring the voltages of the candidate terminals, comparing and analyzing the voltage characteristics of the candidate terminals, discriminating candidate terminals, and outputting the results. Preferably, the switch 120 is a configuration switch.

FIG. 2 is a flow chart illustrating the process of a terminal discriminating method using a terminal discriminating apparatus according to an exemplary embodiment of the present invention. In particular, FIG. 2 shows a method for discriminating candidate terminals according to the voltage characteristics of the candidate terminals.

First, the pull-up voltage and the pull-down voltage of each of the candidate terminals on the PCB of the system 150 are measured by the measurement unit 110 (S210). Next, the discriminating unit 112 compares and analyzes the voltage characteristics of the respective candidate terminals based on the pull-up voltages and the pull-down voltages of the candidate terminals which have been measured by the measurement unit 110, in order to discriminate the candidate terminals (S220). Then, the results of the discrimination of the candidate terminals are output through the output unit 114 (S230).

FIG. 3a is a flow chart illustrating the process of a method for discriminating candidate terminals using a terminal discriminating apparatus according to an exemplary embodiment of the present invention, specifically showing operation S220 of discriminating the candidate terminals in FIG. 2 as described above. In particular, FIG. 3a shows various embodiments of discriminating the candidate terminals according to their voltage characteristics.

The discriminating unit 112 discriminates the candidate terminals in consideration of the functions of the generally used terminals, such as the JTAG terminals (TDI terminal, TDO terminal, TCK terminal, TMS terminal, and TRST terminal), the VCC terminal, the nSRST terminal, the RTCK terminal, and the like, and the voltage characteristics according to the functions.

For example, the discriminating unit 112 discriminates a candidate terminal in which the pull-up voltage and the pull-down voltage are relatively high and the difference between the pull-up voltage and the pull-down voltage is relatively small, among the candidate terminals, as the VCC terminal (S310, S312). As the determination complies with the unique characteristics of the VCC terminal, the VCC terminal for applying a power source voltage has the characteristics of a high pull-up voltage and pull-down voltage and a small difference between the pull-up voltage and the pull-down voltage. Thus, the discriminating unit 112 compares the pull-up voltages, the pull-down voltages, and the differences between the pull-up voltages and the pull-down voltages for the candidate terminals, and discriminates a candidate terminal in which the pull-up voltage and the pull-down voltage are relatively high and the difference between the pull-up voltage and the pull-down voltage is relatively small among the candidate terminals, as a VCC terminal. Of course, as discussed above, the maximum value and the reference value may be calculated, and a candidate terminal having a pull-up voltage and a pull-down voltage that fall within a certain range from the maximum value and having a difference between the pull-up voltage and the pull-down voltage smaller than the reference value may be discriminated as the VCC terminal.

Among the candidate terminals, the discriminating unit 112 discriminates a candidate terminal in which the pull-up voltage is relatively high and the pull-down voltage is a ground voltage, as the TDO terminal (S314, S316). As the determination complies with the unique characteristics of the TDO terminal, the TDO terminal shifts data to outside a device and data is output from the device during a falling edge of a clock generated by the TCK terminal. Thus, the discriminating unit 112 discriminates the TDO terminal based on such characteristics.

Among the candidate terminals, the discriminating unit 112 discriminates a candidate terminal in which the pull-up voltage and the pull-down voltage are the ground voltage as the RTCK terminal (S318, S320). The determination complies with the unique characteristics of the RTCK terminal connected to the JTAG emulator.

Among the candidate terminals, the discriminating unit 112 discriminates a candidate terminal in which the pull-up voltage is relatively low and the pull-down voltage is a ground voltage as the TRST terminal (S322, S324). The determination complies with the unique characteristics of the TRST terminal to which a signal for initializing JTAG is applied.

The five determination references shown in the flow chart of FIG. 3a are proposed merely as an example of references to be used for comparing the candidate terminals based on the pull-up and pull-down voltages of the candidate terminals, and the present invention is not limited thereto. Additionally, various other determination references may be proposed based on the pull-up voltages and the pull-down voltages, whereby the candidate terminals can be compared to be discriminated. In addition, various terminals may be discriminated by comparing their functions and corresponding voltage characteristics. For example, the TDI terminal has a function of shifting data into the device and inputting data to the device during a rising edge of the clock generated by the TCK terminal. The TCK terminal has a function of generating a clock from a system clock, and the TMS terminal has a function of selecting a test mode provided by the JTAG. Thus, various embodiments for discriminating the respective terminals by comparing the voltage characteristics according to the respective functions can be implemented.

Also, in the flow chart of FIG. 3a, the terminals are discriminated by a total of five operations, but the present invention is not limited thereto and the operations may be performed in reverse order, or only some of the operations may be selectively performed.

Figure 3B:
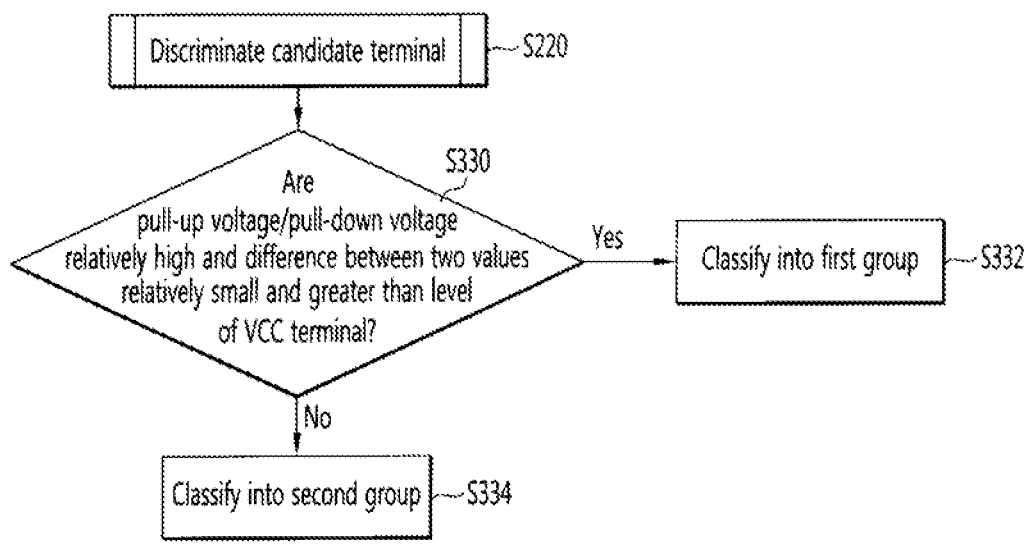
FIG. 3b is a flow chart illustrating the process of a method for classifying candidate terminals into groups according to voltage characteristics of the candidate terminals using the terminal discriminating apparatus according to an exemplary embodiment of the present invention.

FIG. 3b is a flow chart illustrating the process of a method for classifying candidate terminals using the terminal discriminating apparatus according to an exemplary embodiment of the present invention, specifically showing operation S220 of discriminating candidate terminals in FIG. 2 as described above. In particular, FIG. 3b shows an embodiment in which candidate terminals are classified into groups according to the voltage characteristics of the candidate terminals.

The discriminating unit 112 may measure the voltage characteristics of each of the candidate terminals, and classify the candidate terminals having similar voltage characteristics into a group. Hereinafter, the case in which the VCC terminal and the TDO terminal are first discriminated by the discriminating unit 112 and then the candidate terminals are grouped will be described.

Among the candidate terminals, the discriminating unit 112 classifies candidate terminals in which the pull-up voltage and the pull-down voltage are relatively high, and the difference between the pull-up voltage and the pull-down voltage is relatively small and greater than the level of the VCC terminal, into a first group (S330, S332), and classifies the other candidate terminals into a second group (S330, S334). Namely, among the candidate terminals, the discriminating unit 112 classifies the candidate terminals in which the pull-up voltage and the pull-down voltage fall within a certain range from the maximum value and the difference between the pull-up voltage and the pull-down voltage is greater than the reference value, into a first group and the other candidate terminals into a second group. Through this, the candidate terminals having similar voltage characteristics are classified into the same group.

When the candidate terminals are grouped based on such a reference, it is noted that the first group includes at least one of the TMS terminal, the TCK terminal, and the TDI terminal, and the second group includes at least one of the RTCK terminal and the TRST terminal.

Thus, when the candidate terminals are classified into groups in this manner, the respective candidate terminals can be clearly discriminated according to a method of arbitrarily selecting candidate terminals and detecting whether or not an operation is performed according to an input command (to be described).

FIG. 4 is a flow chart illustrating the process of a method for discriminating candidate terminals using the terminal discriminating apparatus according to an exemplary embodiment of the present invention. In particular, FIG. 4 shows a method for arbitrarily selecting candidate terminals and then discriminating the candidate terminals depending on whether or not an operation is performed according to an input command.

First, the discriminating unit 112 arbitrarily selects candidate terminals (S410). Next, the discriminating unit 112 inputs a command according to each function of the arbitrarily selected candidate terminals (S420) and then checks whether or not the system properly operates according to the input command (S430). When the system properly performs an operation according to the input command, because it means that the candidate terminals have been properly selected, the output unit 114 outputs the discrimination results (S440). Meanwhile, when the system does not perform an operation according to the command, because it means that the selection of the candidate terminal is not proper, candidate terminals are re-selected (S450) and then whether or not the system properly operates according to an input command is checked again (S430). Namely, candidate terminals are re-selected until the system properly performs an operation according to an input command, thus discriminating the candidate terminals.

FIGS. 5a to 5c are flow charts illustrating the process of a method for discriminating candidate terminals using the terminal discriminating apparatus according to an exemplary embodiment of the present invention. Specifically, FIGS. 5a to 5c show a detailed embodiment of operations S420, S430, and S450 in FIG. 4.

FIG. 5a shows an embodiment of discriminating the nSRST terminal to which a system initialization signal is input.

First, candidate terminals are arbitrarily selected, and a system reset signal is then input to the candidate terminal arbitrarily selected as the nSRST terminal (S510). Next, when the system is initialized, the corresponding candidate terminal is discriminated as the nSRST terminal (S512, S514). If, however, the system is not initialized, candidate terminals are re-selected (S516) and then whether or not the system properly operates according to an input command is checked again (S510, S512). Namely, the candidate terminals are re-selected until the system is initialized, thus discriminating the nSRST terminal.

FIG. 5b shows an embodiment of discriminating the TMS terminal to which JTAG command is input.

First, candidate terminals are arbitrarily selected, and a test access point (TAP) controller initialization command is then input to the candidate terminal arbitrarily selected as the TMS terminal (S520). Next, when a TAP controller is initialized into test-logic-reset and shift-IR states, the corresponding candidate terminal is discriminated as the TMS terminal (S522, S524). Meanwhile, when the TAP controller is not initialized, candidate terminals are re-selected (S526) and then whether or not the system properly operates according to an input command is checked again (S520, S522). Namely, the candidate terminals are re-selected until the TAP controller is initialized, thus discriminating the TMS terminal.

FIG. 5c shows an embodiment of discriminating the TDI terminal to which data is input. Preferably, this embodiment is performed after the TMS terminal and the TDO terminal are discriminated, so this embodiment will now be described on the assumption that the TMS terminal and the TDO terminal have already been discriminated.

First, a bypass command is input to the TMS terminal to change the system to a JTAG bypass mode (S530). Next, a command is input to the TMS terminal to change the system to a shift-DR, and data is then input to the candidate terminal classified as the TDI terminal (S532). Then, it is detected whether or not the data that has been input to the candidate terminal is output through the TDO terminal (S534). When the input data is output through the TDO terminal, the corresponding candidate terminal is discriminated as the TDI terminal (S536). Meanwhile, when the input data is not output through the TDO terminal, candidate terminals are re-selected (S538) and then data is input to the candidate terminals to check again whether or not the data is output through the TDO terminal (S532, S534). Namely, the candidate terminals are re-selected until the input data is output through the TDO terminal, thus discriminating the TDI terminal.

For reference, FIGS. 2 to 3b show the embodiment in which candidate terminals are discriminated, respectively, according to the voltage characteristics of the candidate terminals, and FIGS. 4 to 5c show the embodiment in which candidate terminals are arbitrarily selected and then discriminated according to whether or not an operation is performed according to an input command. Here, the respective embodiments are proposed with separate flow charts, but the present invention is not limited thereto, and the embodiments proposed in the respective drawings may be performed in combination.

Figure 6A:
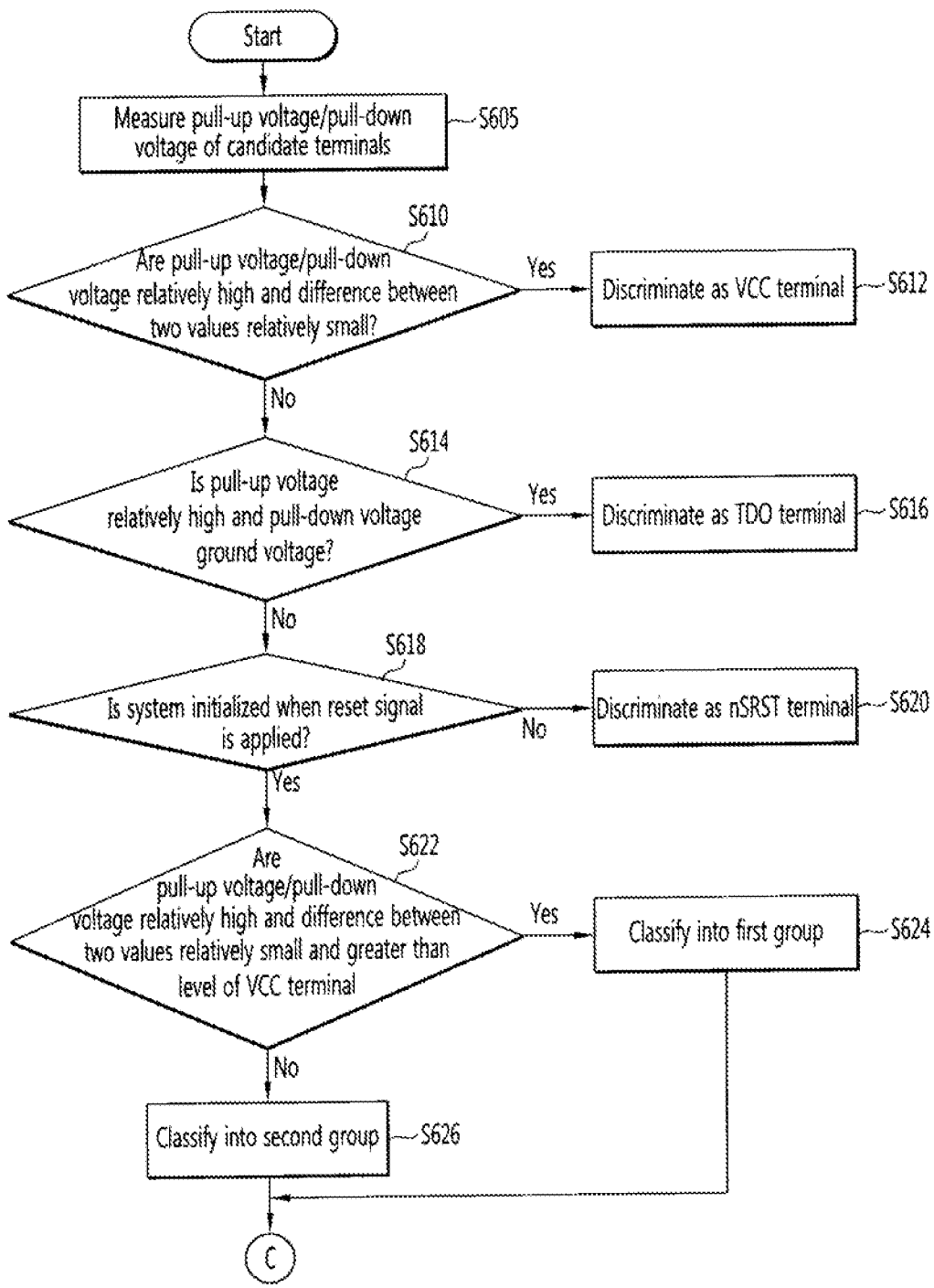

FIGS. 6a and 6b are flow charts illustrating a method for discriminating terminals using the terminal discriminating apparatus according to an exemplary embodiment of the present invention. In particular, FIGS. 6a and 6b show an embodiment in which candidate terminals are discriminated in consideration of both the voltage characteristics of the candidate terminals and whether or not the system operates according to the functions of the candidate terminals.

First, a pull-up voltage and a pull-down voltage of each of the candidate terminals to be discriminated are measured through the measurement unit 110 (S605).

Next, among the candidate terminals, the discriminating unit 112 discriminates a candidate terminal in which the pull-up voltage and the pull-down voltage are relatively high and the difference between the pull-up voltage and the pull-down voltage is relatively small, as the VCC terminal (S610, S612). Also, among the candidate terminals, the discriminating unit 112 discriminates a candidate terminal in which the pull-up voltage is relatively high and the pull-down voltage is a ground voltage, as the TDO terminal (S614, S616). Also, among the candidate terminals, when a reset signal is input to a candidate terminal and the system is reset, the discriminating unit 112 discriminates the corresponding candidate terminal as the nSRST terminal (S618, S620).

Thereafter, among the candidate terminals, the discriminating unit 112 classifies candidate terminals in which the pull-up voltage and the pull-down voltage are relatively high, and the difference between the pull-up voltage and the pull-down voltage is relatively small and greater than the level of the VCC terminal, into a first group (S622, S624) and classifies the other candidate terminals into a second group (S622, S626).

Subsequently, the discriminating unit 112 arbitrarily selects candidate terminals belonging to each group in each group (S628). For example, the discriminating unit 112 arbitrarily selects the candidate terminals included in the first group as one of the TMS terminal, the TCK terminal, and the TDI terminal, respectively, and arbitrarily selects the candidate terminals included in the second group as one of the RTCK terminal and the TRST terminal, respectively.

Then, the discriminating unit 112 inputs the TAP controller initialization command to the candidate terminal arbitrarily selected as the TMS terminal (S630). When the TAP controller is initialized, the discriminating unit 112 discriminates the corresponding candidate terminal as the TMS terminal (S632, S636). Meanwhile, when the TAP controller is not initialized, the discriminating unit 112 re-selects candidate terminals (S634) and then checks again whether or not an operation is performed according to an input command (S630, S632).

Thereafter, the discriminating unit 112 inputs a bypass command to the TMS terminal (S638). Then, the discriminating unit 112 inputs data to the candidate terminal classified as the TDI terminal among the candidate terminals (S640), and then detects whether or not the input data is output through the TDO terminal (S642). When the input data is output through the TDO terminal, the discriminating unit 112 discriminates the corresponding candidate terminal as the TDI terminal (S646). Meanwhile, when the input data is not output, the discriminating unit 112 re-selects candidate terminals (S644) and then checks whether or not the input data is detected (S640, S642).

When the discrimination of the candidate terminals is completed, the output unit 114 outputs the results of the discrimination of the candidate terminals to provide the same to the user (S648).

Figure 7:
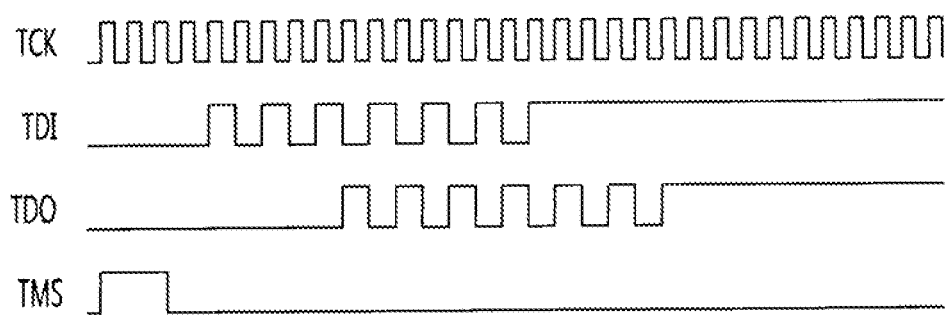
FIG. 7 is a timing diagram showing a case in which data input to a TDI terminal is output through a TDO terminal in a bypass mode.

FIG. 7 is a timing diagram showing a case in which data which has been input to the TDI terminal is output through the TDO terminal in the bypass mode.

As illustrated in FIG. 7, when a bypass command is input to the TMS terminal according to a clock generated by the TCK terminal (hereinafter referred as a 'TCK clock'), the JTAG is changed into the bypass mode. Subsequently, data is input to the device during a rising edge of the TCK clock through the TDI terminal. The data input through the TDI terminal is output through the TDO terminal during a falling edge of the TCK clock.

According to exemplary embodiments of the present invention, the types of candidate terminals can be discriminated by comparing pull-up voltages and pull-down voltages, and the differences between the pull-up and pull-down voltages for the candidate terminals. In addition, candidate terminals can be discriminated such that, candidate terminals are arbitrarily selected and then a command according to each function is input to the arbitrarily selected candidate terminals to determine whether or not an operation according to the command is properly performed, thus discriminating the candidate terminals.

In particular, a JTAG terminal, among terminals on the PCB of a system, can be discriminated. Thus, an internal core and board of the system can be easily tested, and the JTAG terminal and a JTAG emulator can be properly connected to normally operate the system.

In the drawings and specification, there have been disclosed typical exemplary embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A terminal discriminating apparatus comprising:
a measurement unit for measuring a pull-up voltage and a pull-down voltage of each of candidate terminals to be discriminated;
a discriminating unit for discriminating the type of the candidate terminals including at least one of a test data in (TDI) terminal, a test data out (TDO) terminal, a test clock (TCK) terminal, a test mode select (TMS) terminal, a test reset (TRST) terminal, a VCC terminal, an nSRST terminal, and a return test clock (RTCK) terminal by comparing the pull-up voltages, the pull-down voltages, and differences between the pull-up voltages and pull-down voltages of the candidate terminals; and an output unit for outputting results of the discrimination of the candidate terminals transferred from the discriminating unit.

2. The apparatus of claim 1, wherein the discriminating unit discriminates a candidate terminal in which the pull-up and pull-down voltages are relatively high and a difference between the pull-up and pull-down voltages is relatively small, among the candidate terminals, as a VCC terminal.

3. The apparatus of claim 1, wherein the discriminating unit discriminates a candidate terminal in which the pull-up voltage is relatively high and the pull-down voltage is a ground voltage, among the candidate terminals, as a test data out (TDO) terminal.

4. The apparatus of claim 1, wherein the discriminating unit discriminates a candidate terminal in which the pull-up voltage and the pull-down voltage are a ground voltage, among the candidate terminals, as a return test clock (RTCK) terminal.

5. The apparatus of claim 1, wherein the discriminating unit discriminates a candidate terminal in which the pull-up voltage is relatively low and the pull-down voltage is a ground voltage, among the candidate terminals, as a test reset (TRST) terminal.

6. The apparatus of claim 1, wherein the discriminating unit classifies a candidate terminal in which the pull-up voltage and the pull-down voltage are relatively high, and the difference between the pull-up voltage and the pull-down voltage is relatively small and greater than the level of a VCC terminal, among the candidate terminals, into a first group, and the other candidate terminals into a second group.

7. The apparatus of claim 6, wherein the first group comprises at least one of a test mode select (TMS) terminal, a test clock (TCK) terminal, and a test data in (TDI) terminal, and the second group comprises at least one of an RTCK terminal and a TRST terminal.

8. The apparatus of claim 1, wherein the discriminating unit arbitrarily selects the candidate terminals and then inputs a command according to each function to the arbitrarily selected candidate terminals to determine whether or not an operation according to the command is properly performed, thus discriminating the candidate terminals.

9. The apparatus of claim 8, wherein when a system is reset as a reset signal is input to a candidate terminal, among the candidate terminals, the discriminating unit discriminates the candidate terminal as an nSRST (nRESET) terminal.

10. The apparatus of claim 8, wherein when a test access point (TAP) controller is initialized as a TAP initialization command is input to a candidate terminal, the discriminating unit discriminates the candidate terminal as a TMS terminal.

11. The apparatus of claim 8, wherein, in a bypass mode, the discriminating unit re-selects the candidate terminals until data input to the candidate terminal classified as a TDI terminal is output through a TDO terminal, thus discriminating the candidate terminals.

12. A method for discriminating a terminal using a terminal discriminating apparatus, the method comprising:

measuring a pull-up voltage and a pull-down voltage of each of candidate terminals to be discriminated;

discriminating the type of the candidate terminals including at least one of a test data in (TDI) terminal, a test data out (TDO) terminal, a test clock (TCK) terminal, a test mode select (TMS) terminal, a test reset (TRST) terminal, a VCC terminal, an nSRST terminal, and a return test clock (RTCK) terminal by comparing the pull-up voltage, pull-down voltage, and differences between the pull-up and pull-down voltages for the candidate terminals; and outputting results of the discrimination of the candidate terminals.

13. The method of claim 12, wherein, in discriminating the candidate terminals,
a candidate terminal in which the pull-up voltage and the pull-down voltage are relatively high and the difference between the pull-up and pull-down voltages is relatively small among the candidate terminals, is classified as a VCC terminal,
a candidate terminal in which the pull-up voltage is relatively high and the pull-down voltage, is a ground voltage among the candidate terminals, is classified as a test data out (TDO) terminal,
a candidate terminal in which the pull-up voltage and the pull-down voltage are relatively high, and the difference between the pull-up and pull-down voltages is relatively small and greater than the level of the VCC terminal among the candidate terminals, is classified into a first group, and
the other candidate terminals are classified into a second group.

14. The method of claim 13, wherein the first group comprises at least one of a test mode select (TMS) terminal, a test clock (TCK) terminal, and a test data in (TDI) terminal, and the candidate terminals of the second group comprise at least one of an RTCK terminal and a TRST terminal.

15. The method of claim 12, wherein the candidate terminals are arbitrarily selected and then a command according to each function is input to the arbitrarily selected candidate terminals to determine whether or not an operation according to the command is properly performed, thus discriminating the candidate terminals.

16. The method of claim 15, further comprising:
arbitrarily selecting the candidate terminals;
inputting a TAP initialization command to the candidate terminal selected as the TMS terminal;
re-selecting the candidate terminals until the TAP controller is initialized, to select the TMS terminal;
inputting a bypass command to the TMS terminal; and
re-selecting the candidate terminals until data input to the candidate terminal classified as the TDI terminal is output through the TOD terminal, to select the TDI terminal.

* * * * *